US007868705B2

(12) United States Patent
Aramata (10) Patent No.: US 7,868,705 B2
(45) Date of Patent: Jan. 11, 2011

(54) HIGH-FREQUENCY OSCILLATOR AND ELECTRONIC APPARATUS (75) Inventor: Tomohide Aramata, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 67 days.

(21) Appl. No.: 12/199,871

(22) Filed: Aug. 28, 2008

(65) Prior Publication Data
US 2008/0309415 A1 Dec. 18, 2008

Related U.S. Application Data (63) Continuation of application No. PCT/JP2007/050951, filed on Jan. 23, 2007.

(30) Foreign Application Priority Data
Mar. 16, 2006 (JP) .............................. 2006-073134

(51) Int. Cl.
H03B 5/12 (2006.01)
(52) U.S. Cl. ...................... 331/49; 331/48; 331/117 R; 331/179
(58) Field of Classification Search ................... 331/45, 331/49, 117 R, 117 D, 107 DP, 107 SL, 179
See application file for complete search history.

(56) References Cited

U.S. PATENT DOCUMENTS 6,292,063 B1 * 9/2001 Tanemura et al. ............. 331/49

6,411,168 B2 * 6/2002 Yoshida ....................... 331/49
2005/0017814 A1 1/2005 Kawagishi et al.

FOREIGN PATENT DOCUMENTS

| JP | 63-120409 U | 8/1988 |
| JP | 07-030457 A | 1/1995 |
| JP | 2003-152446 A | 5/2003 |

OTHER PUBLICATIONS

Official Communication issued in Internation Patent Application No. PCT/JP2007/050951, mailed on May 1, 2007.

* cited by examiner

*Primary Examiner*—Robert Pascal
*Assistant Examiner*—Ryan Johnson
(74) *Attorney, Agent, or Firm*—Keating & Bennett, LLP (57) ABSTRACT In a high-frequency oscillator, a first resonance circuit and a second resonance circuit are respectively connected to a first amplifier circuit and a second amplifier circuit. A selection circuit includes a first switch circuit and a second switch circuit which selectively operate one of the first amplifier circuit and the second amplifier circuit. A grounded capacitor is connected to output sides of the first amplifier circuit and the second amplifier circuit. The grounded capacitor is commonly used by both the first amplifier circuit and the second amplifier circuit. An auxiliary grounded capacitor is connected between the first switch circuit and the first amplifier circuit. Accordingly, the grounded capacitor and the auxiliary grounded capacitor are connected to each other in parallel only when the first amplifier circuit is activated.

4 Claims, 10 Drawing Sheets

HIGH-FREQUENCY OSCILLATOR AND ELECTRONIC APPARATUS

BACKGROUND OF THE INVENTION

1. Field of the Invention

The present invention relates to frequency selection type high-frequency oscillators that switch between two different oscillating frequencies during operation, and electronic apparatuses including the high-frequency oscillators.

2. Description of the Related Art

In general, a frequency-selecting oscillator which oscillates two high-frequency signals having different frequencies using a single device or circuit is conventionally used in high-frequency oscillator applications, such as a voltage control oscillator (for example, refer to Japanese Unexamined Patent Application Publication No. 2005-57725). Such a frequency-selecting high-frequency oscillator includes a first resonance circuit and a second resonance circuit which resonate at frequencies different from each other, a first amplifier circuit connected to the first resonance circuit, a second amplifier circuit connected to the second resonance circuit, and a selection circuit which selectively activates one of the first and second amplifier circuits. Accordingly, one of the first and second amplifier circuits which are selected using the selection circuit amplifies a resonance signal output from a corresponding one of the first and second resonance circuits, oscillates a high-frequency signal (an output signal) in accordance with the resonance signal, and output the oscillated high-frequency signal.

In the conventional art, the first and second amplifier circuits are implemented using bipolar transistors, both of which are connected to ground using a common capacitor in a high-frequency manner. The common capacitor has an inductance component for a high-frequency signal. Accordingly, to obtain a minimum impedance of the capacitor to the high-frequency signal, a capacitance of the capacitor should be set to be an optimum value in accordance with a frequency of the high-frequency signal. That is, an optimum capacitance of the capacitor varies in accordance with the value of a frequency of the high-frequency signal.

Accordingly, in the conventional art, the capacitance of the grounded capacitor is set to be a value optimum for frequencies of a first and a second high-frequency signal output from the respective first and second amplifier circuits. When the frequencies (oscillating frequencies) of the first and second high-frequency signals have similar values, the optimum capacitances of the capacitor for the first and second high-frequency signals become substantially the same values.

However, if the frequencies of the first and second high-frequency signals have a difference of about 150% or more from each other, the optimum capacitances of the capacitor for the first and second high-frequency signals are different from each other, and accordingly, an oscillating operation of each of the first and second amplifier circuits becomes unstable. Consequently, in a case where a high-frequency oscillator is used as a voltage-control oscillator, for example, a frequency change relative to an output load change is considerably influenced by an unstable oscillating operation.

SUMMARY OF THE INVENTION

In order to overcome the problems described above, preferred embodiments of the present invention provide a high-frequency oscillator capable of improving a frequency change relative to an output load change by making an oscillating operation stable when either one of two amplifier circuits operates, and provide an electronic apparatus including the high-frequency oscillator.

A preferred embodiment of the present invention provides a high-frequency oscillator, including first and second resonance circuits that resonate in frequencies that are different from each other, a first amplifier circuit that is connected to the first resonance circuit and that amplifies a first resonance signal output from the first resonance circuit, a second amplifier circuit that is connected to the second resonance circuit and that amplifies a second resonance signal output from the second resonance circuit, a selection circuit that is connected to the first and second amplifier circuits and that operates one of the first and second amplifier circuits, and a grounded capacitor that is connected to the first and second amplifier circuits and that is used by the first and second amplifier circuits in common.

In this high-frequency oscillator, an auxiliary grounded capacitor is connected to the selection circuit so as to be connected to the grounded capacitor in parallel when one of the first and second amplifier circuits operates, and disconnected from the grounded capacitor when the other of the first and second amplifier circuits operates.

According to a preferred embodiment of the present invention, the selection circuit is used to activate one of the first and second amplifier circuits. Accordingly, for example, when the first amplifier circuit is selected using the selection circuit, the first amplifier circuit amplifies the first resonance signal output from the first resonance circuit, and oscillates to output a high-frequency signal generated in accordance with the first resonance signal. Similarly, when the second amplifier circuit is selected using the selection circuit, the second amplifier circuit oscillates to output a high-frequency signal generated in accordance with the second resonance signal.

In addition, the auxiliary grounded capacitor, which is connected in parallel to the grounded capacitor when the first amplifier circuit is activated, and which is disconnected from the grounded capacitor when the second amplifier circuit is activated, is connected to the selection circuit. Accordingly, when the first amplifier circuit is activated, a synthesized capacitance obtained by adding a capacitance of the auxiliary grounded capacitor to a capacitance of the grounded capacitor is used as a grounded capacitance. On the other hand, when the second amplifier circuit is activated, only the capacitance of the grounded capacitor is used as a grounded capacitance.

Accordingly, the grounded capacitance used when the first amplifier circuit is activated and the grounded capacitance used when the second amplifier circuit is activated can be different from each other. Each of the grounded capacitances can be controlled to have an optimum value in accordance with the frequency output from a corresponding one of the first amplifier circuit and the second amplifier circuit. Consequently, when either one of the first amplifier circuit and the second amplifier circuit is activated, a stable oscillating operation is achieved, and furthermore, the frequency change relative to the output load change is improved.

In this case, according to preferred embodiments of the present invention, the first amplifier circuit may include a first bipolar transistor having a base terminal connected to a power source terminal through a first bias resistor. The second amplifier circuit may include a second bipolar transistor having a base terminal connected to the power source terminal through a second bias resistor. The selection circuit may include a first switch circuit that turns the first bipolar transistor on and off, a second switch circuit that turns the second bipolar transistor on and off so that an operation state of the second bipolar transistor is different from an operation state of the first bipolar transistor, and an input terminal for a switch control signal that supplies a switch control signal to at least one of the first and second switch circuits to change the operation states of the first and second bipolar transistors. At least one of the first and second switch circuits may be arranged between the power source terminal and a corresponding at least one of first and second bias resistors of the first and second bipolar transistors in which the operation status thereof is switched by the at least one of the first and second switch circuits. The grounded capacitor may be connected between the power source terminal and the at least one of the first and second switch circuits. The auxiliary grounded capacitor may be connected between the at least one of the first and second switch circuits and a corresponding at least one of the first and second bias resistors.

According to preferred embodiments of the present invention, the first and second switch circuits operate in accordance with the switch control signal supplied from the input terminal for a switch control signal, activate one of the first and second amplifier circuits, and stop operation of the other of the first and second amplifier circuits. Accordingly, one of the first and second amplifier circuits is selectively activated using the first and second switch circuits.

For example, the first switch circuit is selected to be used as the one of the switch circuits, the first switch circuit is arranged between the first bias resistor and the power supply terminal, the common grounded capacitor is connected between the first switch circuit and the power supply terminal, and the auxiliary grounded capacitor is arranged between the first switch circuit and the first bias resistor.

Accordingly, when the first amplifier circuit is selected using the selection circuit, the first switch circuit is used to connect the bias resistor to the power supply terminal so that a bias voltage is supplied to the first amplifier circuit. In this case, the auxiliary grounded capacitor is connected to the common grounded capacitor in parallel.

On the other hand, when the second amplifier circuit is selected using the selection circuit, the first switch circuit is used to disconnect the bias resistor from the power source terminal so that supply of the bias voltage to the first amplifier circuit is stopped. In this case, the auxiliary grounded capacitor is disconnected from the common grounded capacitor.

When the second switch circuit is selected to be used as the one of the switch circuits, similarly to the case where the first switch circuit is used, the second switch circuit is used to connect/disconnect the auxiliary grounded capacitor to/from the common grounded capacitor. Accordingly, the grounded capacitance used when the first amplifier circuit is activated and the grounded capacitance used when the second amplifier circuit is activated can be different from each other. Each of the grounded capacitances can be controlled to have an optimum value in accordance with the frequency output from a corresponding one of the first amplifier circuit and the second amplifier circuit.

Moreover, since the auxiliary grounded capacitor is connected to/disconnected from the common grounded capacitor using one of the first and second switch circuits, an additional switch circuit used for the auxiliary grounded capacitor is not necessary. Accordingly, the optimum values of the grounded capacitances for the first and second amplifier circuits are obtained by merely adding the auxiliary grounded capacitor, and furthermore, a production cost is reduced and a stable oscillating operation are achieved.

Moreover, the auxiliary grounded capacitor is connected to/disconnected from the common grounded capacitor using the first and second switch circuits used for selecting one of the first and second amplifier circuits. Accordingly, when an operation of the first amplifier circuit is switched to an operation of the second amplifier circuit, or vice versa, a connection state of the auxiliary grounded capacitor is also changed simultaneously. Consequently, a switch operation between the first and second amplifier circuits and a change of the connection state of the auxiliary grounded capacitor are both performed without a time delay. Thus, a high-frequency signal is stably oscillated even at the time of the switch operation.

According to a preferred embodiment of the present invention, a buffer circuit is connected to the first and second amplifier circuits in common. The buffer circuit amplifies a signal output from each of the first and second amplifier circuits may be provided.

Accordingly, the signal output from one of the first and second amplifier circuit can be amplified using the buffer circuit.

According to a preferred embodiment of the present invention, the buffer circuit may include a third bipolar transistor. An emitter terminal of the third bipolar transistor included in the buffer circuit may be cascade-connected to collector terminals of the first and second bipolar transistors. One of the first and second switch circuits to which the auxiliary grounded capacitor is connected may be connected to the emitter terminal of the third bipolar transistor included in the buffer circuit.

According to this preferred embodiment of the present invention, because the emitter terminal of the third bipolar transistor included in the buffer circuit is cascade-connected to the collector terminals of the first and second bipolar transistors, the third bipolar transistor included in the buffer circuit operates in accordance with the first and second bipolar transistors and amplifies a high-frequency signals output from each of the first and second bipolar transistors.

Furthermore, since one of the first and second switch circuits, to which the auxiliary grounded capacitor is connected, is connected to the emitter terminal of the third bipolar transistor included in the buffer circuit, the auxiliary grounded capacitor is connected to/disconnected from the emitter terminal of the third bipolar transistor included in the buffer terminal using the one of the first and second switch circuits. Here, when the common grounded capacitor is connected to the emitter terminal of the third bipolar transistor included in the buffer circuit, the collectors of the first and second bipolar transistors are connected to the ground in a high-frequency manner using the common grounded capacitor.

Accordingly, the one of the first and second switch circuits is used to connect/disconnect the auxiliary grounded capacitor to/from the common grounded capacitor connected to the collectors of the first and second bipolar transistors.

According to a preferred embodiment of the present invention, the other of the first and second switch circuits may be connected to an emitter resistor of a corresponding one of the first and second bipolar transistors in which an operation state thereof is switched by the other of the first and second switch circuits.

According to this preferred embodiment of the present invention, for example, the second switch circuit is selected to be used as the other of the switch circuits, the second switch circuit is connected to the emitter resistor of the second bipolar transistor. By this arrangement, the second switch circuit can be used to supply or to stop supplying a current (bias current) between the base terminal and the emitter terminal of the second bipolar transistor, and to change an operation state of the second amplifier circuit. Furthermore, when the first switch circuit is selected to be used as the other of the switch circuit, similarly to the case where the second switch circuit is used, the first switch circuit can be used to change an operation state of the first amplifier circuit.

According to a preferred embodiment of the present invention, each one of the first and second switch circuits may be constituted by or include a PNP transistor or an NPN transistor.

By suitably selecting one of a PNP transistor and an NPN transistor for each of the first and second switch circuits, one of the first and second switch circuits can enter a connected state, and the other of the first and second switch circuits can enter a disconnected state using a single switch control signal. Accordingly, one of the first and second amplifier circuits is selectively activated using the single switch control signal.

The high-frequency oscillator according to a preferred embodiment the present invention may be used to configure an electronic apparatus.

In this case, when either one of the two high-frequency signals having different frequencies is oscillated, a stable oscillating operation of the high-frequency oscillator is attained. Accordingly, a frequency change relative to an output load change of the high-frequency oscillator can be improved, and a stable operation of the electronic apparatus is achieved.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

High-frequency oscillators and electronic apparatuses according to preferred embodiments of the present invention will be described hereinafter with reference to the accompanying drawings.

Figure 1:
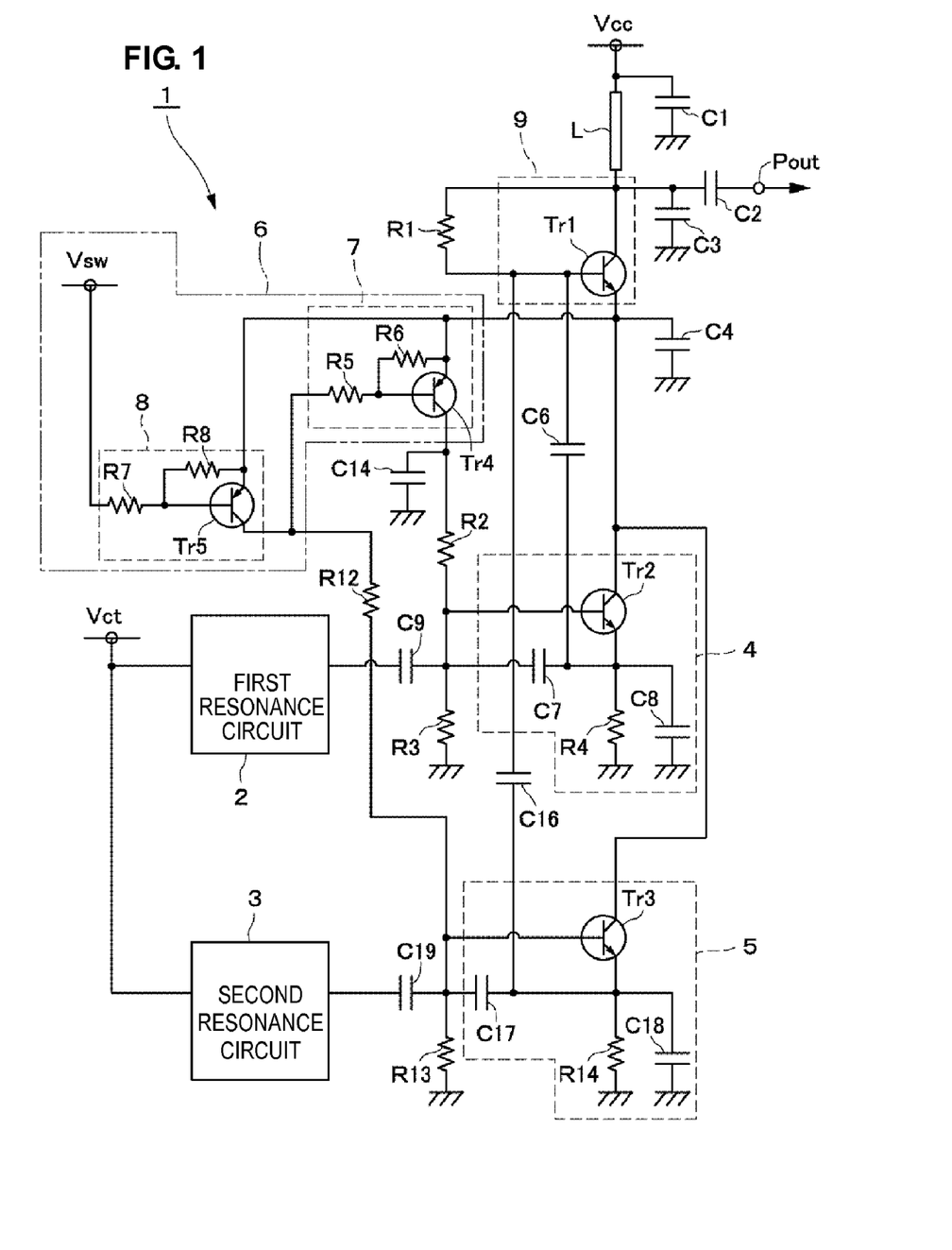
FIG. 1 is a circuit diagram illustrating a high-frequency oscillator according to a first preferred embodiment of the present invention.

FIG. 1 shows a high-frequency oscillator 1 according to a first preferred embodiment. In FIG. 1, the high-frequency oscillator 1 is a frequency-selection type voltage-control oscillator that selects and outputs one of two high-frequency signals having different frequencies. The high-frequency oscillator 1 includes a first resonance circuit 2, a second resonance circuit 3, a first amplifier circuit 4, a second amplifier circuit 5, a selection circuit 6, and a buffer circuit 9.

The first resonance circuit 2 includes a circuit which resonates at a frequency F1 of approximately 1.7 GHz, for example. The second resonance circuit 3 includes a circuit which resonates at frequency F2 of approximately 4.3 GHz, for example, which is different from the frequency F1. The first resonance circuit 2 and the second resonance circuit 3 are connected to an input terminal Vct for a resonance control signal. Accordingly, each of the resonant frequencies F1 and F2 of the first resonance circuit 2 and the second resonance circuit 3, respectively, is changed in a corresponding range in accordance with a voltage supplied from the input terminal Vct for a resonance control signal.

The first amplifier circuit 4 includes a first transistor device Tr2, capacitors C7 and C8, and an emitter resistor R4. The transistor device Tr2 is an NPN bipolar transistor, for example. A base terminal of the transistor device Tr2 is connected to the first resonance circuit 2 through a coupling capacitor C9, and is also connected between a first terminal of a bias resistor R2 and a first terminal of a voltage-dividing resistor R3 connected to each other in series.

A second terminal of the voltage-dividing resistor R3 is connected to ground. A second terminal of the bias resistor R2 is connected to a collector terminal of a transistor device Tr4 of a switch circuit 7 which will be described later.

An emitter terminal of the transistor device Tr2 is connected to the ground through a circuit including the emitter resistor R4 and the capacitor C8 connected to each other in parallel. The emitter terminal of the transistor device Tr2 is also connected to a base terminal of a transistor device Tr1 included in the buffer circuit 9 through a coupling capacitor C6. A collector terminal of the transistor device Tr2 is cascade-connected to an emitter terminal of the transistor device Tr1 included in the buffer circuit 9. The capacitor C7 is connected between the base and emitter terminals of the transistor device Tr2.

The first resonance circuit 2, the first amplifier circuit 4, and coupling capacitor C9 constitute a first oscillator circuit.

The second amplifier circuit 5 includes a second transistor device Tr3, capacitors C17 and C18, and an emitter resistor R14. The second transistor device Tr3 is an NPN bipolar transistor, for example. A base terminal of the transistor device Tr3 is connected to the second resonance circuit 3 through a coupling capacitor C19, and also connected between a first terminal of a bias resistor R12 and a first terminal of a voltage-dividing resistor R13.

A second terminal of the voltage-dividing resistor R13 is connected to the ground. A second terminal of the bias resistor R12 is connected to a collector terminal of a transistor device Tr5 included in a switch circuit 8 which will be described later.

An emitter terminal of the transistor device Tr3 is connected to the ground through a circuit including the emitter resistor R14 and the capacitor C18 connected to each other in parallel. The emitter terminal of the transistor device Tr3 is also connected to the base terminal of a transistor device Tr1 included in the buffer circuit 9 through a coupling capacitor C16. A collector terminal of the transistor device Tr3 is cascade-connected to the emitter terminal of the transistor device Tr1 included in the buffer circuit 9. The capacitor C17 is connected between the base and emitter terminals of the transistor device Tr3.

The second resonance circuit 3, the second amplifier circuit 5, and coupling capacitor C19 constitute a second oscillator circuit.

The selection circuit 6 selectively operates one of the first amplifier circuit 4 and the second amplifier circuit 5. The selection circuit 6 includes the first switch circuit 7, the second switch circuit 8, which will be described later, and an input terminal Vsw for a switch control signal.

The first switch circuit 7 is used to start and stop operation of the transistor device Tr2 included in the first amplifier circuit 4. The first switch circuit 7 includes the transistor device Tr4, and resistors R5 and R6. The transistor device Tr4 is a PNP bipolar transistor, for example.

A base terminal of the transistor device Tr4 is connected to the collector terminal of the transistor device Tr5 included in the second switch circuit 8 through the resistor R5. The resistor R6 is connected between the base terminal and an emitter terminal of the transistor device Tr4. The emitter terminal of the transistor device Tr4 is also connected to the emitter terminal of the transistor device Tr1 included in the buffer circuit 9, which will be described later. Accordingly, the first switch circuit 7 is connected to a power source terminal Vcc through the buffer circuit 9. A collector terminal of the transistor device Tr4 is connected to the base terminal of the transistor device Tr2 included in the first amplifier circuit 4 through the bias resistor R2.

When the transistor device Tr4 is turned on, the first switch circuit 7 is used to connect the bias resistor R2 to the power source terminal Vcc. Accordingly, a power supply voltage supplied from the power source terminal Vcc is divided by the bias resistor R2 and voltage-dividing resistor R3, and a divided voltage is supplied to the transistor device Tr2 as a bias voltage. Accordingly, the transistor device Tr2 is turned on, and thereby the first amplifier circuit 4 is activated.

On the other hand, when the transistor device Tr4 is turned off, the first switch circuit 7 is used to disconnect the bias resistor R2 from the power source terminal Vcc. Accordingly, supply of the bias voltage to the transistor device Tr2 is stopped. Accordingly, the transistor device Tr2 is turned off, and thereby an operation of the second amplifier circuit 5 stops.

The second switch circuit 8 is used to start and stop operation of the transistor device Tr3 included in the second amplifier circuit 5. The second switch circuit 8 includes the transistor device Tr5, and resistors R7 and R8. The transistor device Tr5 is a PNP bipolar transistor, for example.

A base terminal of the transistor device Tr5 is connected to an input terminal Vsw for a switch control signal through the resistor R7. The resistor R8 is connected between the base terminal and an emitter terminal of the transistor device Tr5. The emitter terminal of the transistor device Tr5 is also connected to the emitter terminal of the transistor device Tr1 included in the buffer circuit 9, which will be described later.

Accordingly, the second switch circuit 8 is connected to a power source terminal Vcc through the buffer circuit 9. The collector terminal of the transistor device Tr5 is connected to the base terminal of the transistor device Tr3 included in the second amplifier circuit 5 through the bias resistor R12.

When the transistor device Tr5 is turned on, the second switch circuit 8 is used to connect the bias resistor R12 to the power source terminal Vcc. Accordingly, a power supply voltage supplied from the power source terminal Vcc is divided by the bias resistor R12 and the voltage-dividing resistor R13, and a divided voltage is supplied to the transistor device Tr3 as a bias voltage. Accordingly, the transistor device Tr3 is turned on, and thereby the second amplifier circuit 5 is activated.

On the other hand, when the transistor device Tr5 is turned off, the second switch circuit 8 is used to disconnect the bias resistor R12 from the power source terminal Vcc. Accordingly, supply of the bias voltage to the transistor device Tr3 is stopped. Accordingly, the transistor device Tr3 is turned off, and thereby an operation of the second amplifier circuit 5 stops.

The input terminal Vsw for a switch control signal is used for inputting a switch control signal to the second switch circuit 8, and is connected to the base terminal of the transistor device Tr5 through a resistor R7. For example, one of a high-level switch control signal and a low-level switch control signal is input to the input terminal Vsw for a switch control signal.

When the low-level switch control signal is input to the input terminal Vsw for a switch control signal, a base potential of the transistor device Tr5 included in the second switch circuit 8 decreases. Accordingly, since a potential difference between the base and emitter terminals of the transistor device Tr5 becomes equal to or larger than a threshold voltage, the transistor device Tr5 is turned on.

When the transistor device Tr5 is turned on, a base potential of the transistor device Tr4 included in the first switch circuit 7 increases. Accordingly, since a potential difference between the base and emitter terminals of the transistor device Tr4 becomes smaller than the threshold voltage, the transistor device Tr4 is turned off.

On the other hand, when a high-level switch control signal is input to the input terminal Vsw for a switch control signal, the base potential of the transistor device Tr5 included in the second switch circuit 8 increases. Accordingly, since a potential difference between the base and emitter terminals of the transistor device Tr5 becomes smaller than the threshold voltage, the transistor device Tr5 is turned off.

When the transistor device Tr5 is turned off, a base potential of the transistor device Tr4 included in the first switch circuit 7 decreases. Accordingly, since a potential difference between the base and emitter terminals of the transistor device Tr4 becomes equal to or larger than the threshold voltage, the transistor device Tr4 is turned on.

Consequently, the input terminal Vsw for a switch control signal is used to input a switch control signal to the second switch circuit 8 so that operation states of the transistor devices Tr4 and Tr5 are changed. That is, the input terminal Vsw for a switch control signal is used to change operation states of the transistor devices Tr2 and Tr3 included in the first amplifier circuit 4 and the second amplifier circuit 5, respectively, using the transistor devices Tr4 and Tr5.

The buffer circuit 9 is connected to the first amplifier circuit 4 and the second amplifier circuit 5 in common, and amplifies signals output from the first amplifier circuit 4 and second amplifier circuit 5. The buffer circuit 9 includes an NPN bipolar transistor device Tr1, for example.

The collector terminal of the transistor device Tr1 is connected to the ground through a capacitor C3, and is connected to an oscillation-signal output terminal Pout through a coupling capacitor C2. The collector terminal of the transistor device Tr1 is connected to the power source terminal Vcc through a line L, and the power source terminal Vcc is connected to the ground through a capacitor C1. A bias resistor R1 is connected between the base and the collector terminals of the transistor device Tr1.

The emitter terminal of the transistor device Tr1 is cascade-connected to the collector terminals of the first transistor device Tr2 and the second transistor device Tr3 (included in the first amplifier circuit 4 and the second amplifier circuit 5, respectively). Accordingly, the transistor device Tr1 included in the buffer circuit 9 amplifies signals output from the first transistor device Tr2 and the second transistor device Tr3.

The emitter terminal of the transistor device Tr1 is connected to the emitter terminals of the transistor device Tr4 and the transistor device Tr5 (included in the first switch circuit 7 and second switch circuit 8, respectively). Accordingly, a power source voltage input to the power source terminal Vcc is supplied through the transistor device Tr1 to each of the emitter terminals of the transistor device Tr4 and the transistor device Tr5.

The first amplifier circuit 4 and the second amplifier circuit 5 use a common grounded capacitor C4. The capacitor C4 has a first terminal connected to the collector terminals of the first transistor device Tr2 and the second transistor device Tr3, and has a second terminal connected to the ground. Accordingly, the collector terminals of the first transistor device Tr2 and the second transistor device Tr3 are connected to the ground through the grounded capacitor C4 in a high-frequency manner. In other words, the collector terminals of the first transistor device Tr2 and the second transistor device Tr3 are grounded in a high-frequency area.

The first terminal of the grounded capacitor C4 is connected to the emitter terminals of the transistor device Tr4 and the transistor device Tr5 (included in the first switch circuit 7 and the second switch circuit 8, respectively), and is also connected to the emitter terminal of the transistor device Tr1 (included in the buffer circuit 9). Accordingly, the first terminal of the grounded capacitor C4 is connected between the first switch circuit 7 or the second switch circuit 8 and the power source terminal Vcc.

An auxiliary grounded capacitor C14 has a first terminal connected between the first switch circuit 7 and the bias resistor R2, and a second terminal connected to the ground. The auxiliary grounded capacitor C14 is connected to the collector terminal of the transistor device Tr4. On the other hand, the grounded capacitor C4 is connected to the emitter terminal of the transistor device Tr4. Accordingly, when the transistor device Tr4 is turned on, the auxiliary grounded capacitor C14 is connected to the grounded capacitor C4 in parallel whereas when the transistor device Tr4 is turned off, the auxiliary grounded capacitor C14 is disconnected from the grounded capacitor C4.

The high-frequency oscillator 1 of this preferred embodiment has a configuration as described above, and an operation thereof will be described hereinafter.

First, a case where a low-level switch control signal is input to the input terminal Vsw for a switch control signal will now be described. In this case, the base potential of the transistor device Tr5 included in the second switch circuit 8 decreases, and thereby the transistor device Tr5 is turned on. At this time, a power supply voltage divided using a voltage-dividing circuit including the bias resistor R12 and the voltage-dividing resistor R13 is applied as a bias voltage (driving voltage) to the base terminal of the transistor device Tr3 included in the second amplifier circuit 5. By this, the transistor device Tr3 is turned on, and accordingly, the second amplifier circuit 5 amplifies a resonance signal having the frequency F2 output from the second resonance circuit 3 and outputs a signal obtained in accordance with the resonance signal to the buffer circuit 9. Then, the buffer circuit 9 amplifies the signal having the frequency F2 output from the second resonance circuit 3 and outputs the amplified signal from the oscillation-signal output terminal Pout to the outside.

On the other hand, when the transistor device Tr5 included in the second switch circuit 8 is in an on-state, the base potential of the transistor device Tr4 included in the first switch circuit 7 increases. By this, the transistor device Tr4 is turned off, and the power supply voltage (bias voltage) is not applied to the transistor device Tr2 included in the first amplifier circuit 4. Accordingly, the transistor device Tr2 is turned off and an operation of the first amplifier circuit 4 stops.

Thus, when a low-level switch control signal is input to the input terminal Vsw for a switch control signal, the high-frequency oscillator 1 outputs a signal having a frequency F2.

Next, a case where a high-level switch control signal is input to the input terminal Vsw for a switch control signal will be described. In this case, the base potential of the transistor device Tr5 included in the second switch circuit 8 increases, and thereby the transistor device Tr5 is turned off. Accordingly, the power supply voltage (bias voltage) is not applied to the transistor device Tr3 included in the second amplifier circuit 5. Consequently, the transistor device Tr3 is turned off, and an operation of the second amplifier circuit 5 stops.

On the other hand, when the transistor device Tr5 included in the second switch circuit 8 is in an off-state, the base potential of the transistor device Tr4 included in the first switch circuit 7 decreases, and thereby the transistor device Tr4 is turned on. At this time, a power supply voltage divided using a voltage-dividing circuit including the bias resistor R2 and the voltage-dividing resistor R3 is applied as a bias voltage (driving voltage) to the base terminal of the transistor device Tr2 included in the first amplifier circuit 4. By this, the transistor device Tr2 is turned on, and accordingly, the first amplifier circuit 4 amplifies a resonance signal having the frequency F1 output from the first resonance circuit 2 and outputs a signal obtained in accordance with the resonance signal to the buffer circuit 9. Then, the buffer circuit 9 amplifies the signal having the frequency F1 output from the first resonance circuit 2 and outputs the amplified signal from the oscillation-signal output terminal Pout to the outside.

Thus, when a high-level switch control signal is input to the input terminal Vsw for a switch control signal, the high-frequency oscillator 1 outputs a signal having a frequency F1.

As described above, one of the first switch circuit 7 and the second switch circuit 8 is selectively brought into an on-state in accordance with a switch control signal, and the other is in an off-state. Accordingly, only one of the first amplifier circuit 4 and the second amplifier circuit 5 operates. Consequently, the high-frequency oscillator 1 outputs a high-frequency signal having one of the two different frequencies F1 and F2.

In the high-frequency oscillator 1 of this preferred embodiment, the collector terminals of the first transistor device Tr2 and the second transistor device Tr3 are connected to the ground through the grounded capacitor C4 and the auxiliary grounded capacitor C14. The relationship between the grounded capacitor C4 and a frequency change relative to an output load change and the relationship between the auxiliary grounded capacitor C14 and a frequency change relative to an output load change will now be described.

Figure 2:
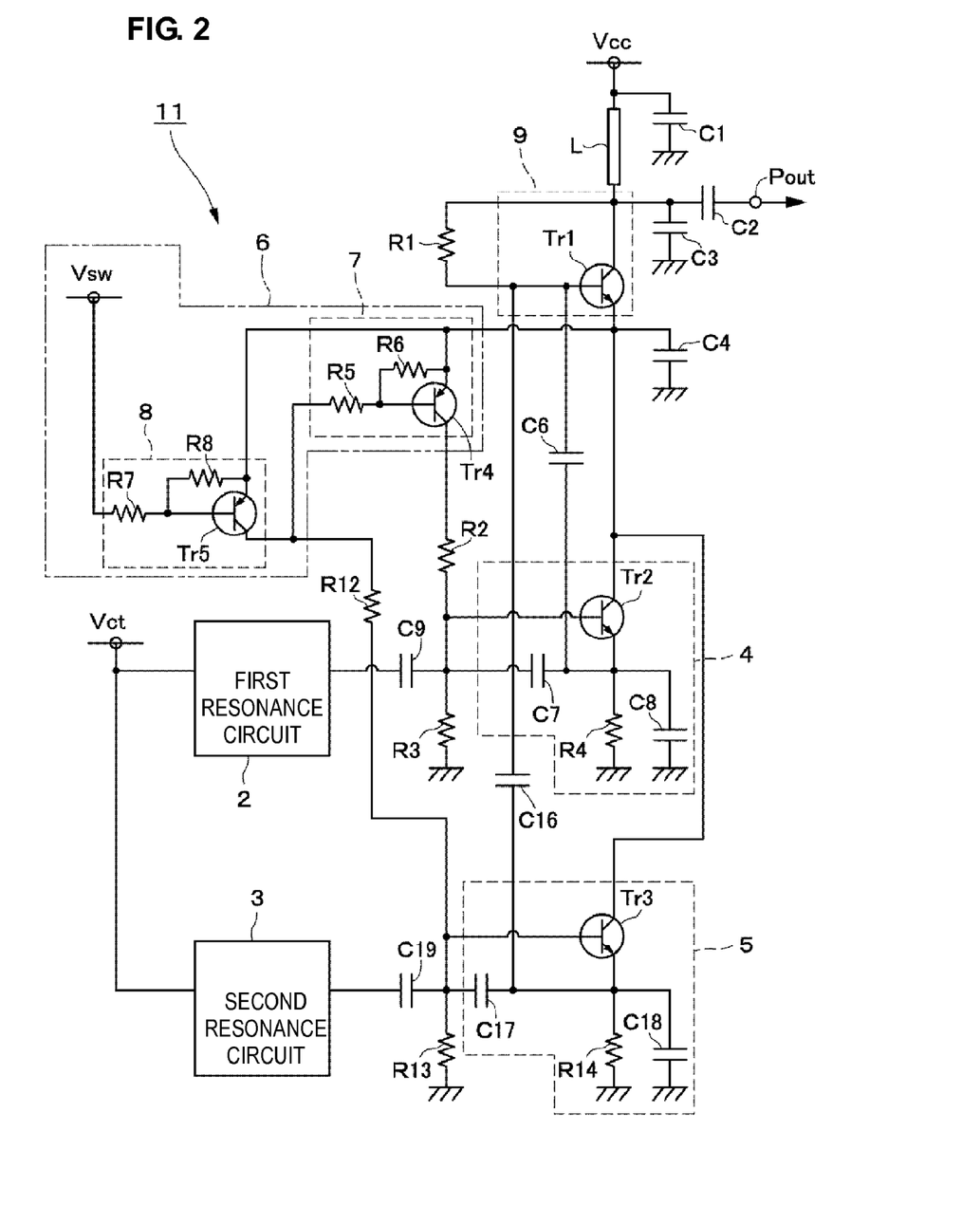
FIG. 2 is a circuit diagram illustrating a high-frequency oscillator of a comparative example.
Figure 3:
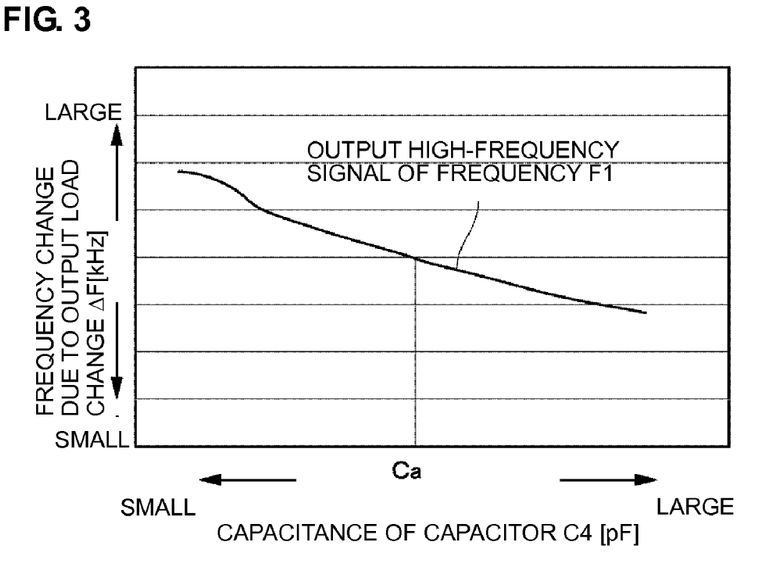
FIG. 3 is a graph illustrating the relationship between a capacitance of a grounded capacitor and a frequency change relative to an output load change when a first amplifier circuit of the comparative example operates.
Figure 4:
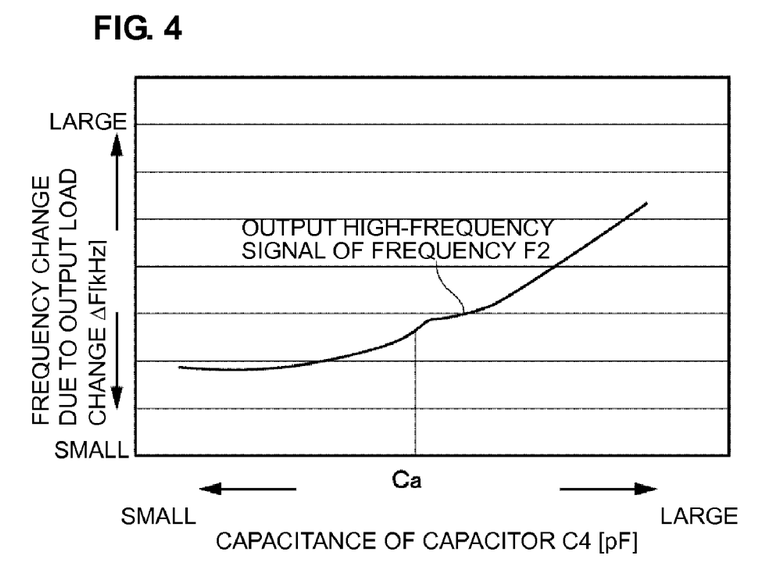
FIG. 4 is a graph illustrating the relationship between the capacitance of the grounded capacitor and the frequency change relative to the output load change when a second amplifier circuit of the comparative example operates.

Referring to a comparative example shown in FIG. 2, a capacitance of the grounded capacitor C4 and a frequency change ΔF relative to an output load change are measured for a high-frequency oscillator 11 in which the auxiliary grounded capacitor C14 is not provided. Note that a voltage standing wave ratio (VSWR) is set to 2 for all phases. FIG. 3 shows a measurement result of the frequency change ΔF when the first amplifier circuit 4 operates, and FIG. 4 shows a measurement result of the frequency change ΔF when the second amplifier circuit 5 operates.

According to the measurement result shown in FIG. 3, in a band of the frequency F1, as the capacitance of the grounded capacitor C4 increases, a frequency change ΔF decreases. On the other hand, according to the measurement result shown in FIG. 4, in a band of the frequency F2 which is higher than the frequency F1 (F2>F1), as the capacitance of the grounded capacitor C4 increases, the frequency change ΔF increases.

To minimize the frequency change ΔF, an impedance of the grounded capacitor C4 should be reduced as much as possible. Furthermore, to minimize the impedance of the grounded capacitor C4 utilizing an inductance component of the grounded capacitor C4, the capacitance of the grounded capacitor C4 is set to be a specific optimum value. If the capacitance of the grounded capacitor C4 shifts a value larger than or smaller than the optimum value, the impedance of the grounded capacitor C4 increases. That is, the frequency change ΔF has a minimum value similarly to a quadratic function relative to a change in the capacitance of the grounded capacitor C4, for example.

The optimum capacitance of the grounded capacitor C4 is different for each of the frequencies F1 and F2. Generally, as the frequency of the high-frequency signal decreases, the optimum capacitance of the grounded capacitor C4 increases. Accordingly, in order to make the frequency change ΔF smaller, in the band of the frequency F1, the capacitance of the grounded capacitor C4 needs to be increased, whereas in the band of the frequency F2, the capacitance of the grounded capacitor C4 needs to be decreased. Accordingly, when only the grounded capacitor C4 is used as shown in the comparative example, an oscillation operation of the high-frequency oscillator 1 becomes unstable, and the frequency change ΔF relative to the output load change increases.

Figure 5:
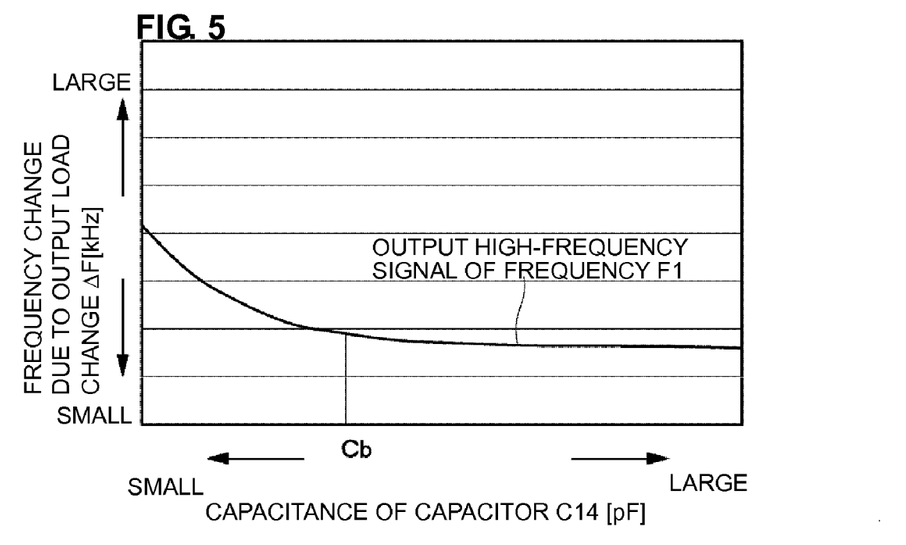
FIG. 5 is a graph illustrating the relationship between a capacitance of an auxiliary grounded capacitor and a frequency change relative to an output load change when a first amplifier circuit of the first preferred embodiment operates.
Figure 6:
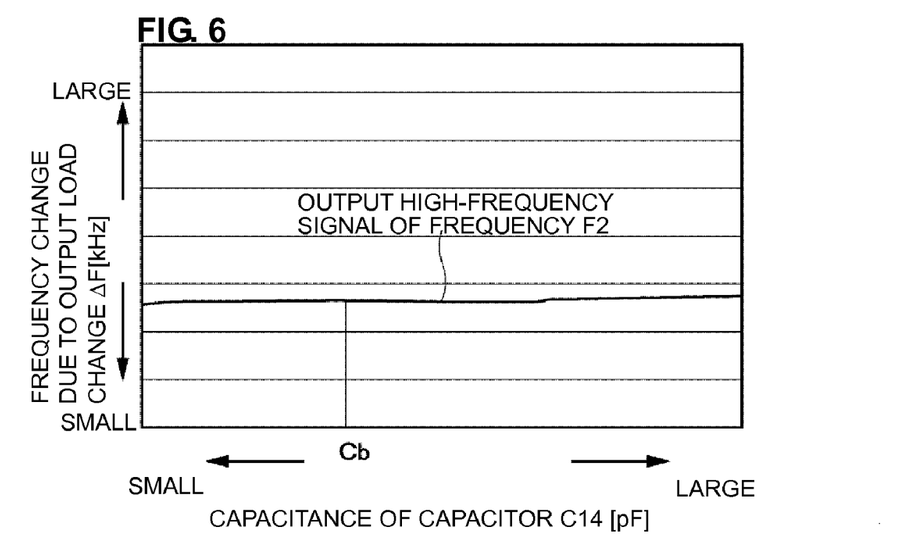
FIG. 6 is a graph illustrating the relationship between the capacitance of the auxiliary grounded capacitor and the frequency change relative to the output load change when a second amplifier circuit of the first preferred embodiment operates.

A capacitance of the auxiliary grounded capacitor C14 and a frequency change ΔF relative to an output load change are measured for a high-frequency oscillator 1 in which the auxiliary grounded capacitor C14 is additionally used as shown in this preferred embodiment. Note that a capacitance of the grounded capacitor C4 is set to be a value (a point Ca show in FIGS. 3 and 4) which makes the frequency change ΔF small in the band of the frequency F2. The voltage standing wave ratio (VSWR) is set to 2 for all phases. FIG. 5 shows a measurement result of the frequency change ΔF when the first amplifier circuit 4 is activated. FIG. 6 shows a measurement result of the frequency change ΔF when the second amplifier circuit 5 is activated.

According to the measurement result shown in FIG. 5, in the band of the frequency F1, as the capacitance of the auxiliary grounded capacitor C14 increases, the frequency change ΔF decreases. This is because when a high-frequency signal having the frequency F1 is output, the transistor device Tr4 is turned on and the auxiliary grounded capacitor C14 is connected to the grounded capacitor C4 in parallel.

Accordingly, when the capacitance of the auxiliary grounded capacitor C14 increases, a synthesized capacitance obtained by adding the capacitance of the auxiliary grounded capacitor C14 to the capacitance of the grounded capacitor C4 increases. Consequently, even in the band of the frequency F1, an impedance of a parallel circuit including the grounded capacitor C4 and the auxiliary grounded capacitor C14 is small, and accordingly, the frequency change ΔF relative to the output load change is also small.

On the other hand, according to the measurement result shown in FIG. 6, in the band of the frequency F2, even when the capacitance of the auxiliary grounded capacitor C14 is changed, the frequency change ΔF is not changed, that is, the frequency change ΔF is stable. This is because when a high-frequency signal having the frequency F2 is output, the transistor device Tr4 is turned off, and thereby the grounded capacitor C4, which is arranged on the oscillation-signal output terminal Pout side, and the auxiliary grounded capacitor C14 are disconnected. Accordingly, the high-frequency signal having the frequency F2 is not influenced by the use of the auxiliary grounded capacitor C14.

Consequently, the capacitance of the grounded capacitor C4 is set to be a value, for example, a point Ca shown in FIGS. 3 and 4 which makes the frequency change ΔF small in the band of the frequency F2. On the other hand, the capacitance of the auxiliary grounded capacitor C14 is set to be a value, for example, a point Cb shown in FIGS. 5 and 6 which makes the frequency change ΔF small in the band of the frequency F1.

In this preferred embodiment, the auxiliary grounded capacitor C14, which is connected to the grounded capacitor C4 in parallel when the first amplifier circuit 4 is activated and which is disconnected from the grounded capacitor C4 when the second amplifier circuit 5 is activated, is arranged in the selection circuit 6. Accordingly, when the first amplifier circuit 4 is activated, the synthesized capacitance obtained by adding the capacitance of the auxiliary grounded capacitor C14 to the capacitance of the grounded capacitor C4 is used as a grounded capacitance. On the other hand, when the second amplifier circuit 5 is activated, only the capacitance of the grounded capacitor C4 is used as a grounded capacitance.

Accordingly, the grounded capacitance used when the first amplifier circuit 4 is activated and the grounded capacitance used when the second amplifier circuit 5 is activated can be different from each other. The grounded capacitances can be controlled to have optimum values in accordance with the frequencies F1 and F2 output from the first amplifier circuit 4 and the second amplifier circuit 5, respectively. Consequently, when either one of the first amplifier circuit 4 and the second amplifier circuit 5 is activated, a stable oscillating operation is achieved and furthermore, the frequency change relative to the output load change is improved.

Moreover, since the auxiliary grounded capacitor C14 is connected to/disconnected from the common grounded capacitor C4 using the first switch circuit 7 included in the selection circuit 6, an additional switch circuit used for the auxiliary grounded capacitor C14 is not necessary. Accordingly, the optimum values of the grounded capacitances for the first amplifier circuit 4 and the second amplifier circuit 5 are obtained by merely adding the auxiliary grounded capacitor C14, and furthermore, a production cost is reduced and a stable oscillating operation is achieved.

Moreover, in this preferred embodiment, the auxiliary grounded capacitor C14 is connected to/disconnected from the common grounded capacitor C4 using the first switch circuit 7 and the second switch circuit 8 used for selecting one of the first amplifier circuit 4 and the second amplifier circuit 5. Accordingly, when an operation of the first amplifier circuit 4 is switched to an operation of the second amplifier circuit 5 or vice versa, a connection state of the auxiliary grounded capacitor C14 is also changed simultaneously. Consequently, a switch operation between the first amplifier circuit 4 and the second amplifier circuit 5 and a change of the connection state of the auxiliary grounded capacitor C14 are performed without time delay. Thus, a high-frequency signal is stably oscillated even at the time of the switch operation.

Furthermore, since the buffer circuit 9 to which the first amplifier circuit 4 and the second amplifier circuit 5 are connected in common is provided, signals output from the first amplifier circuit 4 and the second amplifier circuit 5 are amplified using the buffer circuit 9.

In this case, the common grounded capacitor C4 is connected to the emitter terminal of the transistor device Tr1 included in the buffer circuit 9. Accordingly, the collector terminals of the transistor device Tr2 and the transistor device Tr3 are connected to the ground in a high-frequency manner using the common grounded capacitor C4. In addition, the first switch circuit 7 is connected to the emitter terminal of the transistor device Tr1 included in the buffer circuit 9. Accordingly, the auxiliary grounded capacitor C14 is connected to/disconnected from the emitter terminal of the transistor device Tr1 included in the buffer circuit 9. Consequently, the auxiliary grounded capacitor C14 is connected to/disconnected from the common grounded capacitor C4 which is connected to the collector terminals of the transistor device Tr2 and the transistor device Tr3 using the first switch circuit 7.

Furthermore, the first switch circuit 7 and the second switch circuit 8 include PNP transistor devices Tr4 and Tr5, respectively. Since the emitter terminals of the transistor device Tr4 and the Tr5 are connected to the power source terminal Vcc, and the base terminal of the transistor device Tr4 is connected to the collector terminal of the transistor device Tr5, each of the transistor device Tr4 and the transistor device Tr5 is switched between an on-state and an off-state so that the transistor device Tr4 and the transistor device Tr5 are in different states from each other. Furthermore, since a switch control signal is input to the base terminal of the transistor device Tr5, each of the transistor device Tr4 and the transistor device Tr5 is switched between the on-state and the off-state with ease in accordance with the switch control signal. Accordingly, one of the first switch circuit 7 and the second switch circuit 8 is selected to be in the on-state using the single switch control signal, and thereby one of the first amplifier circuit 4 and the second amplifier circuit 5 is selected to be activated.

Figure 7:
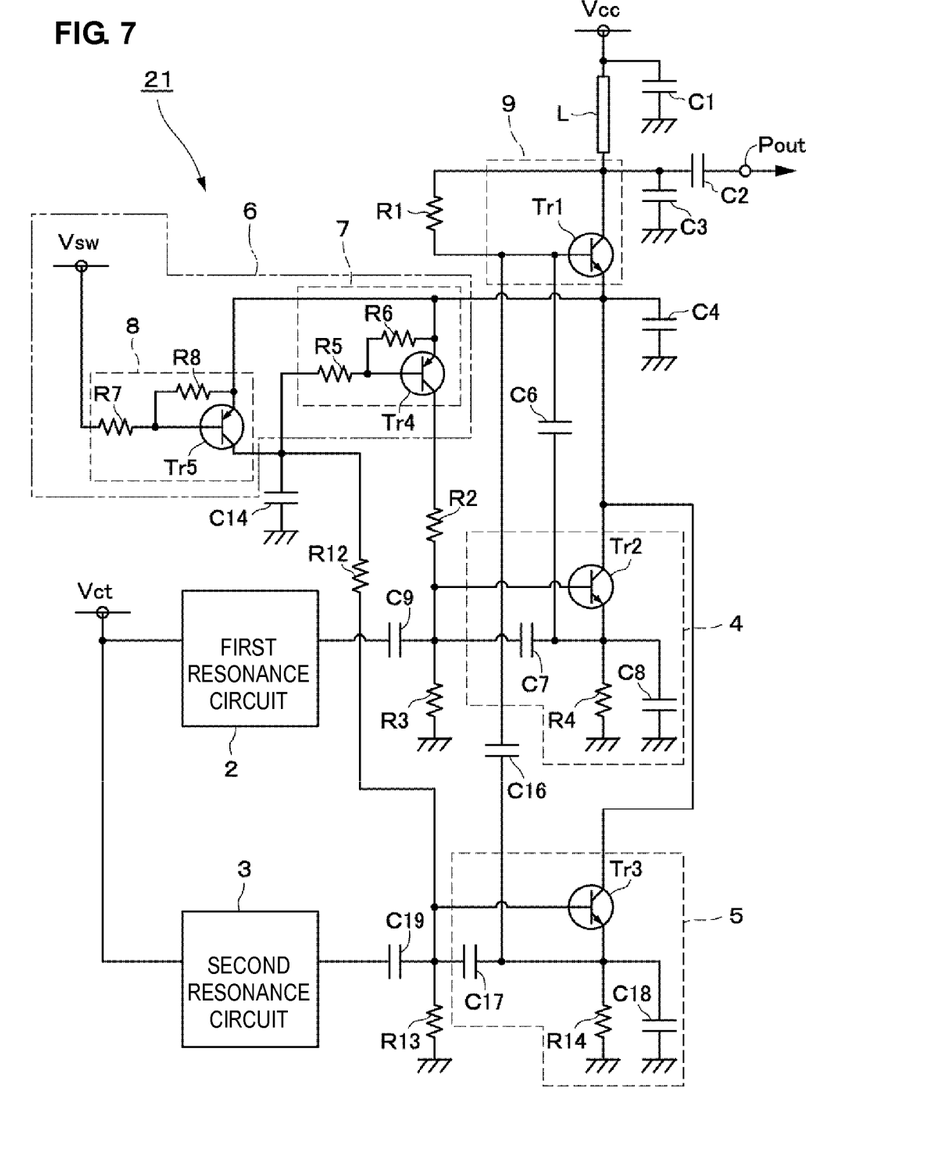
FIG. 7 is a circuit diagram illustrating a high-frequency oscillator according to a first modification.

Note that, in the high-frequency oscillator 1 according to the first preferred embodiment, the auxiliary grounded capacitor C14 is connected to the first switch circuit 7. However, the present invention is not limited to this. For example, as a high-frequency oscillator 21 of a first modification shown in FIG. 7, the auxiliary grounded capacitor C14 may be connected to the second switch circuit 8. In this case, the auxiliary grounded capacitor C14 is connected between the collector terminal of the transistor device Tr5 and the bias resistor R12 of the second amplifier circuit 5.

Figure 8:
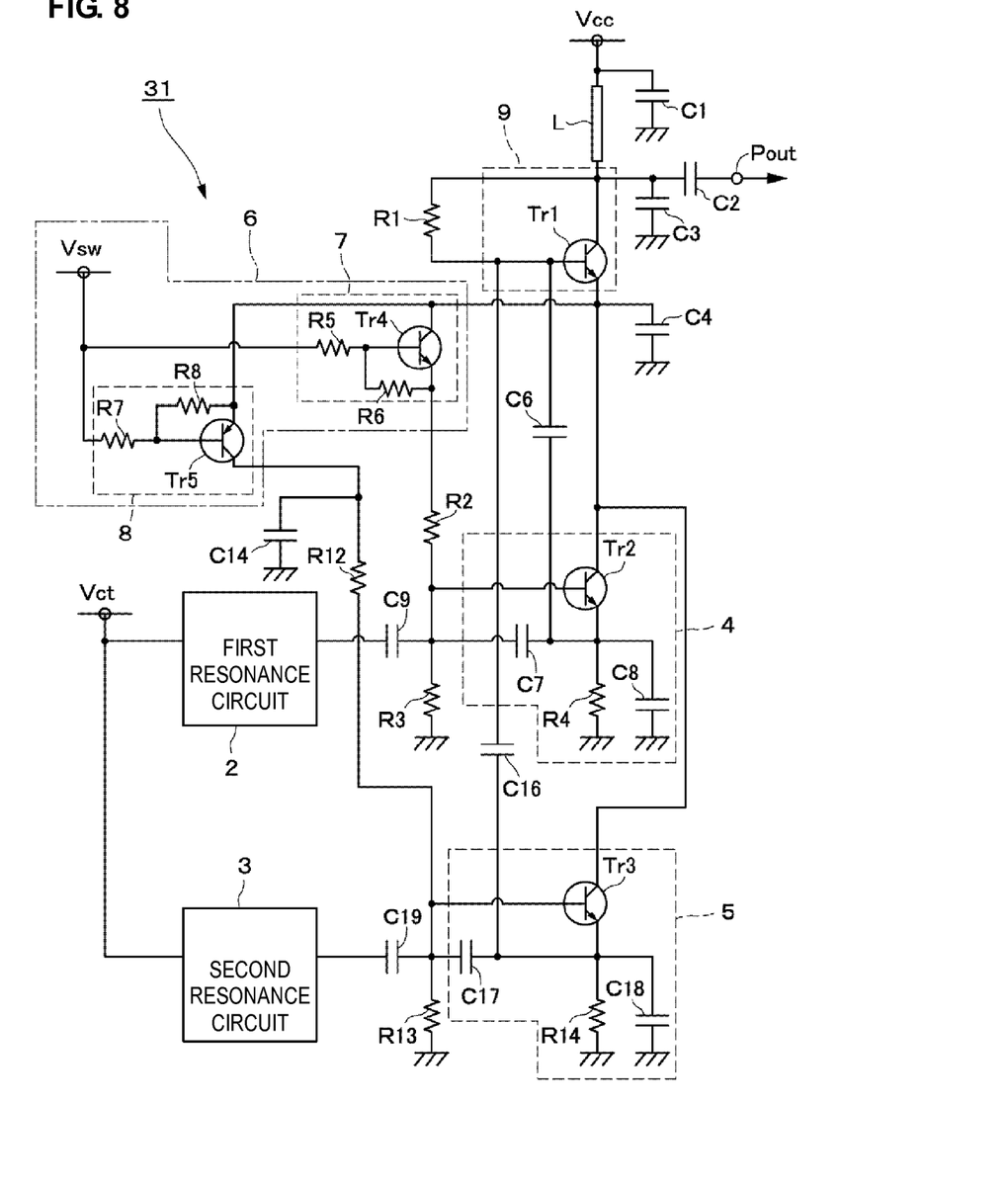
FIG. 8 is a circuit diagram illustrating a high-frequency oscillator according to a second preferred embodiment of the present invention.

FIG. 8 shows a high-frequency oscillator according to a second preferred embodiment of the present invention. This preferred embodiment is characterized in that a first switch circuit includes an NPN transistor and a second switch circuit includes a PNP transistor. Note that reference numerals the same as those of the first preferred embodiment are used in this preferred embodiment to denote the same components, and therefore descriptions thereof are omitted.

In a high-frequency oscillator 31 shown in FIG. 8, a first switch circuit 7 is used to start and stop an operation of a transistor device Tr2 included in a first amplifier circuit 4. The first switch circuit 7 includes a transistor device Tr4, and resistors R5 and R6. The transistor device Tr4 is an NPN bipolar transistor, for example.

A base terminal of the transistor device Tr4 is connected to an input terminal Vsw for a switch control signal through the resistor R5. The resistor R6 is connected between the base terminal and an emitter terminal of the transistor device Tr4. A collector terminal of the transistor device Tr4 is connected to an emitter terminal of a transistor device Tr1 included in a buffer circuit 9. Accordingly, the first switch circuit 7 is connected to a power source terminal Vcc through the buffer circuit 9. The emitter terminal of the transistor device Tr4 is connected to a base terminal of the transistor device Tr2 included in a first amplifier circuit 4 through a bias resistor R2.

A second switch circuit 8 is used to start and stop an operation of a transistor device Tr3 included in a second amplifier circuit 5. The second switch circuit 8 includes a transistor device Tr5, and resistors R7 and R8. The transistor device Tr5 is a PNP bipolar transistor, for example.

A base terminal of the transistor device Tr5 is connected to an input terminal Vsw for a switch control signal through the resistor R7. The resistor R8 is connected between the base terminal and an emitter terminal of the transistor device Tr5. The emitter terminal of the transistor device Tr5 is also connected to the emitter terminal of the transistor device Tr1 included in the buffer circuit 9. Accordingly, the second switch circuit 8 is connected to the power source terminal Vcc through the buffer circuit 9. A collector terminal of the transistor device Tr5 is connected to a base terminal of the transistor device Tr3 included in the second amplifier circuit 5 through a bias resistor R12.

When a low-level switch control signal is input to the input terminal Vsw for a switch control signal, base potentials of the transistor devices Tr4 and Tr5 decrease. In this case, a potential difference between the base terminal and the emitter terminal of the transistor device Tr4 is lower than a threshold voltage, and the transistor device Tr4 included in the first switch circuit 7 is turned off. On the other hand, a potential difference between the base terminal and the emitter terminal of the transistor device Tr5 is equal to or higher than the threshold voltage, and the transistor device Tr5 included in the second switch circuit 8 is turned on.

When a high-level switch control signal is input to the input terminal Vsw for a switch control signal, the base potentials of the transistor devices Tr4 and Tr5 increase. In this case, a potential difference between the base terminal and the emitter terminal of the transistor device Tr4 is equal to or higher than the threshold voltage, and the transistor device Tr4 included in the first switch circuit 7 is turned on. On the other hand, a potential difference between the base terminal and the emitter terminal of the transistor device Tr5 is lower than the threshold voltage, and the transistor device Tr5 included in the second switch circuit 8 is turned off.

An auxiliary grounded capacitor C14 is connected between the transistor device Tr5 included in the second switch circuit 8 and the bias resistor R12. Therefore, when the transistor device Tr5 included in the second switch circuit 8 is turned on, and thereby the second amplifier circuit 5 is activated, the auxiliary grounded capacitor C14 is connected to the grounded capacitor C4 in parallel. On the other hand, when the transistor device Tr5 included in the second switch circuit 8 is turned off, and the first amplifier circuit 4 is activated, the auxiliary grounded capacitor C14 is disconnected from the grounded capacitor C4.

Consequently, in the second preferred embodiment, operations and advantages the same as those of the first preferred embodiment can be achieved.

Figure 9:
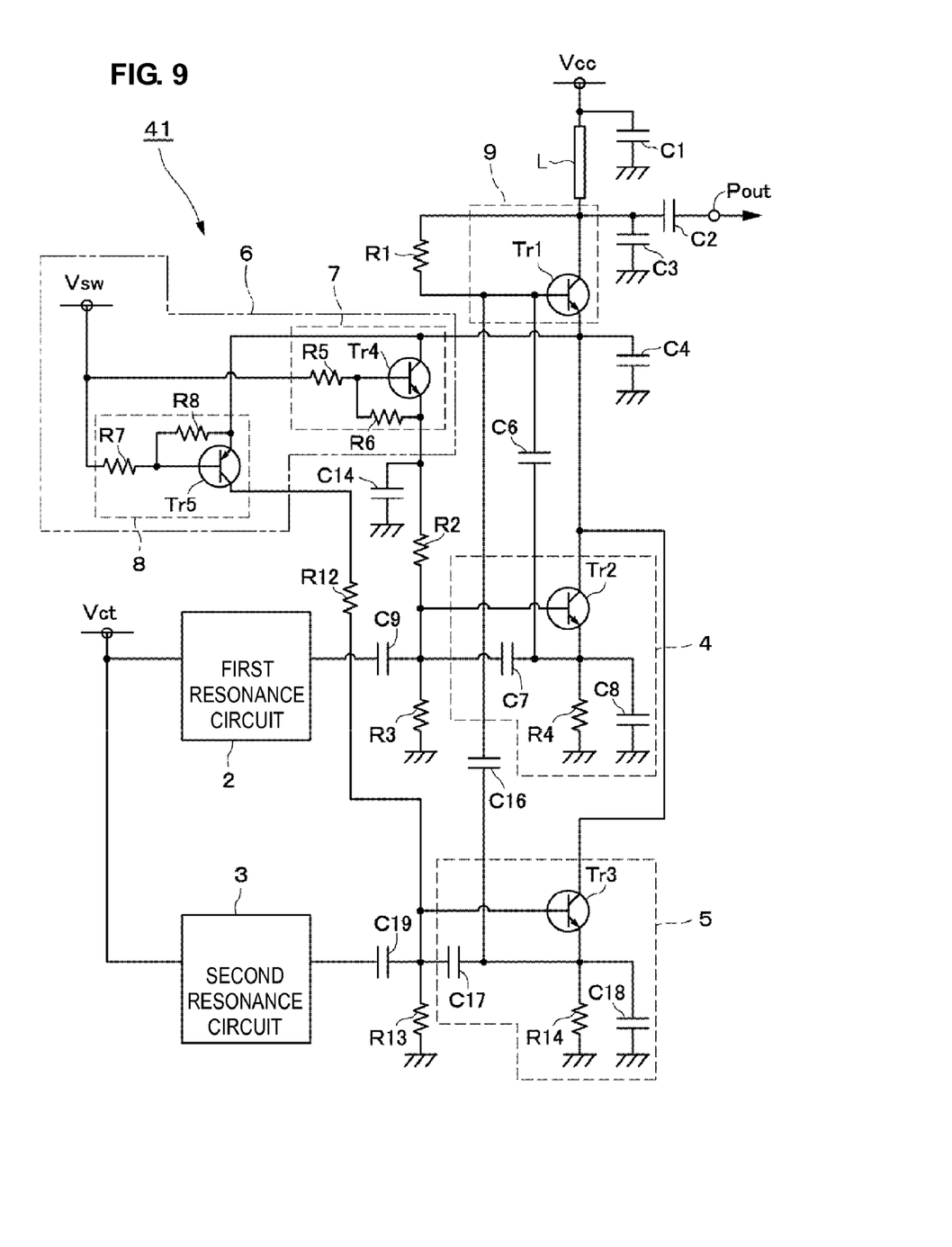
FIG. 9 is a circuit diagram illustrating a high-frequency oscillator according to a second modification.

In the high-frequency oscillator 31 of the second preferred embodiment, the auxiliary grounded capacitor C14 preferably is connected to the second switch circuit 8. However, the present invention is not limited to this. For example, as a high-frequency oscillator 41 of a second modification shown in FIG. 9, the auxiliary grounded capacitor C14 may be connected to the first switch circuit 7. In this case, the auxiliary grounded capacitor C14 is connected between the emitter terminal of the transistor device Tr4 and the bias resistor R2 of the first amplifier circuit 4.

Figure 10:
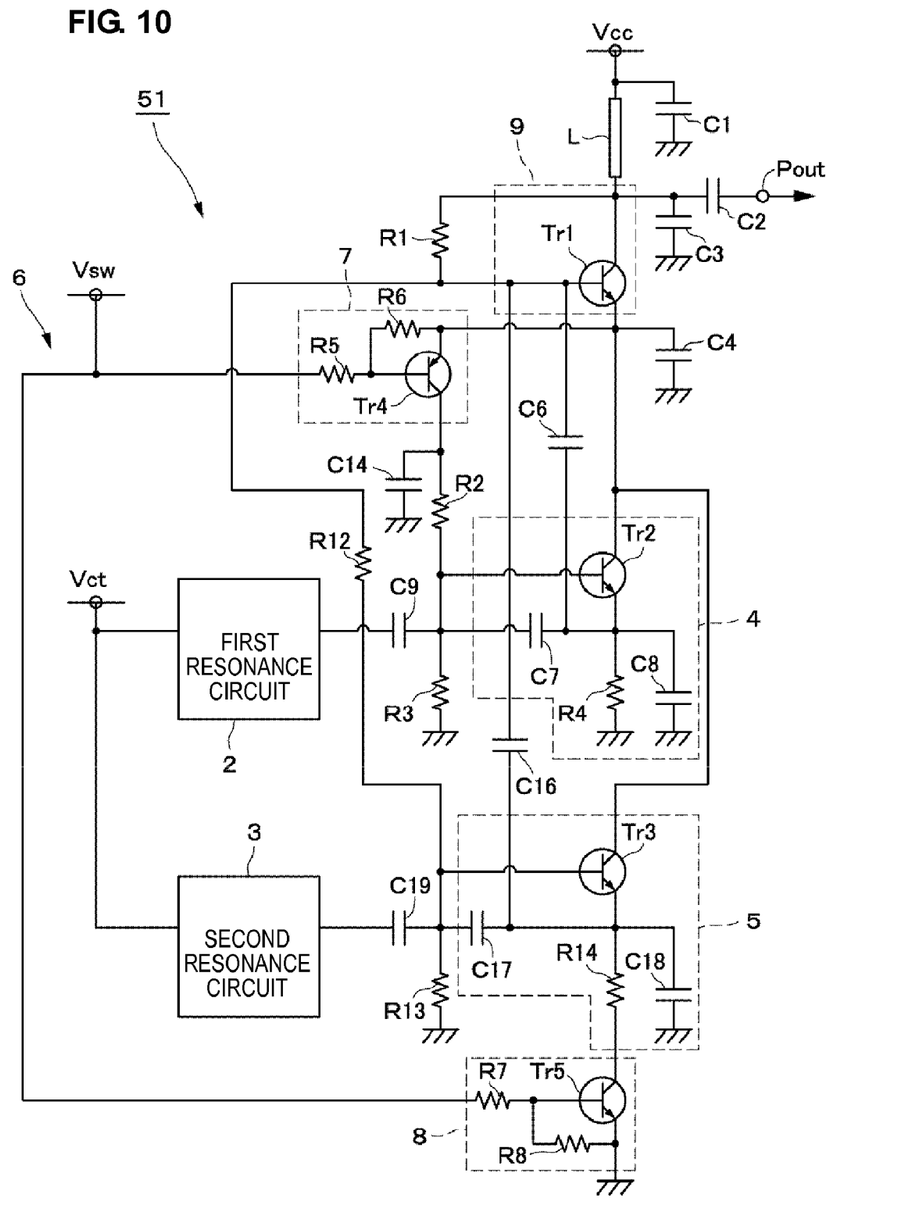
FIG. 10 is a circuit diagram illustrating a high-frequency oscillator according to a third preferred embodiment of the present invention.

FIG. 10 shows a high-frequency oscillator according to a third preferred embodiment of the present invention. The third preferred embodiment is characterized in that an auxiliary grounded capacitor is connected to a first switch circuit, and a second switch circuit is connected to an emitter resistor of a second transistor device. Note that reference numerals the same as those of the first preferred embodiment are used in this preferred embodiment to denote the same components, and therefore descriptions thereof are omitted.

In a high-frequency oscillator 51 shown in FIG. 10, an auxiliary grounded capacitor C14 is connected between a first switch circuit 7 and a bias resistor R2 similarly to the first preferred embodiment. A transistor device Tr4 included in the first switch circuit 7 is a PNP bipolar transistor, for example. A base terminal of the transistor device Tr4 is connected to an input terminal Vsw for a switch control signal through a resistor R5.

A second switch circuit 8 is used to start and stop an operation of a transistor device Tr3 included in a second amplifier circuit 5. The second switch circuit 8 includes a transistor device Tr5, and resistors R7 and R8. The transistor device Tr5 is an NPN bipolar transistor, for example.

A base terminal of the transistor device Tr5 is connected to an input terminal Vsw for a switch control signal through a resistor R7. A resistor R8 is connected between the base terminal and an emitter terminal of the transistor device Tr5. The emitter terminal of the transistor device Tr5 is also connected to the ground. A collector terminal of the transistor device Tr5 is connected to an emitter resistor R14 of the transistor device Tr3.

A base terminal of the transistor device Tr3 of the second amplifier circuit 5 is connected to a base terminal of a transistor device Tr1 included in a buffer circuit 9 through a bias resistor R12. Accordingly, the base terminal of the transistor device Tr3 is connected to a power source terminal Vcc through a bias resistor R1 and the bias resistor R12. Therefore, a bias voltage is applied to the base terminal of the transistor device Tr3 through the bias resistors R1 and R12.

When a low-level switch control signal is input to the input terminal Vsw for a switch control signal, base potentials of the transistor devices Tr4 and Tr5 decrease. In this case, a potential difference between the base terminal and the emitter terminal of the transistor device Tr4 is equal to or higher than a threshold voltage, and the transistor device Tr4 included in the first switch circuit 7 is turned on. On the other hand, a potential difference between the base terminal and the emitter terminal of the transistor device Tr5 is lower than the threshold voltage, and the transistor device Tr5 included in the second switch circuit 8 is turned off.

When a high-level switch control signal is input to the input terminal Vsw for a switch control signal, the base potentials of the transistor devices Tr4 and Tr5 increase. In this case, the potential difference between the base terminal and the emitter terminal of the transistor device Tr4 is lower than a threshold voltage, and the transistor device Tr4 included in the first switch circuit 7 is turned off. On the other hand, the potential difference between the base terminal and the emitter terminal of the transistor device Tr5 is equal to or higher than the threshold voltage, and the transistor device Tr5 included in the second switch circuit 8 is turned on.

Accordingly, the first switch circuit 7 and the second switch circuit 8 are used to select and activate one of the first amplifier circuit 4 and the second amplifier circuit 5.

Consequently, in the third preferred embodiment, operations and advantages the same as those of the first preferred embodiment can be achieved. In the third preferred embodiment, the second switch circuit 8 preferably is connected to the emitter resistor R14 of the transistor device Tr3. By this, the second switch circuit 8 is used to supply or to stop supplying a current (bias current) between the base terminal and the emitter terminal of the transistor device Tr3 and used to change an operation state of the second amplifier circuit 5.

Figure 11:
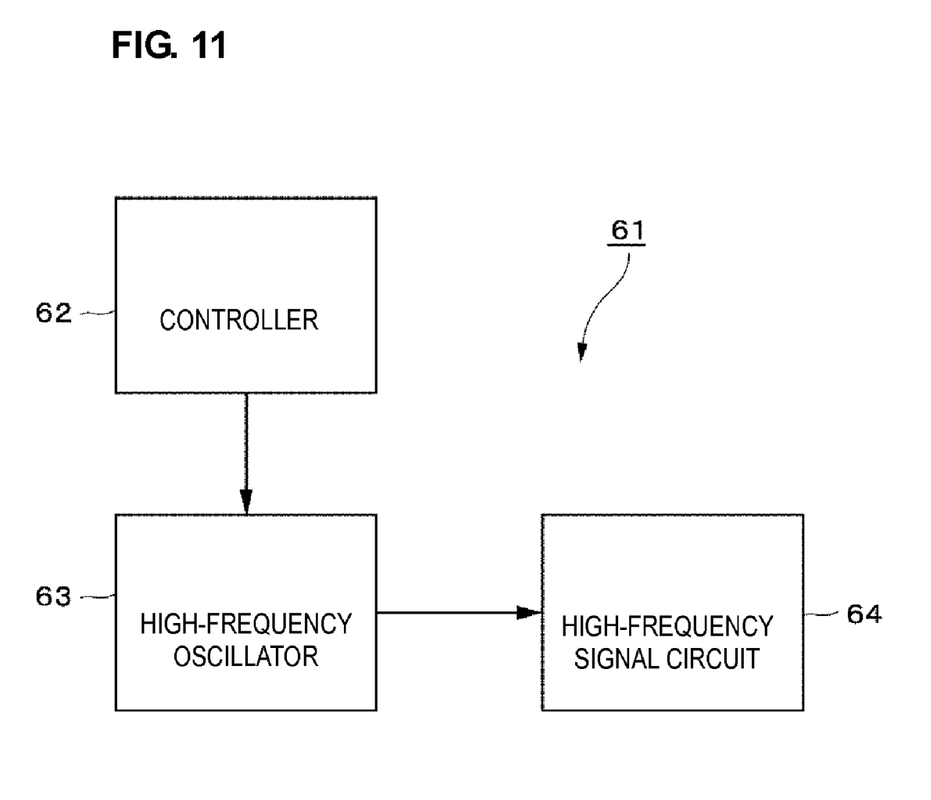
FIG. 11 is a block diagram illustrating an electronic apparatus according to a fourth preferred embodiment of the present invention.

FIG. 11 shows a fourth preferred embodiment of the present invention. The fourth preferred embodiment is characterized in that an electronic apparatus is constituted by a high-frequency oscillator according to any one of the preferred embodiments of the present invention described above. Reference numerals the same as those of the first preferred embodiment are used in the fourth preferred embodiment to denote the same components, and therefore descriptions thereof are omitted.

An electronic apparatus 61 shown in FIG. 11 includes a controller 62 that controls an operation of the electronic apparatus 61, a high-frequency oscillator 63 that outputs a high-frequency signal, and a high-frequency signal circuit 64 that performs a circuit operation utilizing the high-frequency signal output from the high-frequency oscillator 63.

A high-frequency oscillator 63 is constituted by any one of the high-frequency oscillators 1, 31, and 51 according to the first to third preferred embodiments, and high-frequency oscillators 21 and 41 according to the first and second modifications. In addition, the high-frequency oscillator 63 selects and outputs one of two high-frequency signals having different frequencies F1 and F2.

The controller 62 is used to supply a switch control signal according to a program preinstalled, which is used to change a frequency of a high-frequency signal output from the high-frequency oscillator 63, to an input terminal Vsw for a switch control signal of the high-frequency oscillator 63.

According to this preferred embodiment, since the high-frequency oscillator 63 is included in the electronic apparatus 61, when either one of the high-frequency signals having different frequencies F1 and F2 is oscillated, a stable oscillating operation of the high-frequency oscillator 63 is attained. Accordingly, even when an output load of the high-frequency oscillator 63 varies in accordance with an operation of the high-frequency signal circuit 64, a frequency change relative to the output load change can be improved, and a stable operation of the electronic apparatus 61 is achieved.

Figure 12:
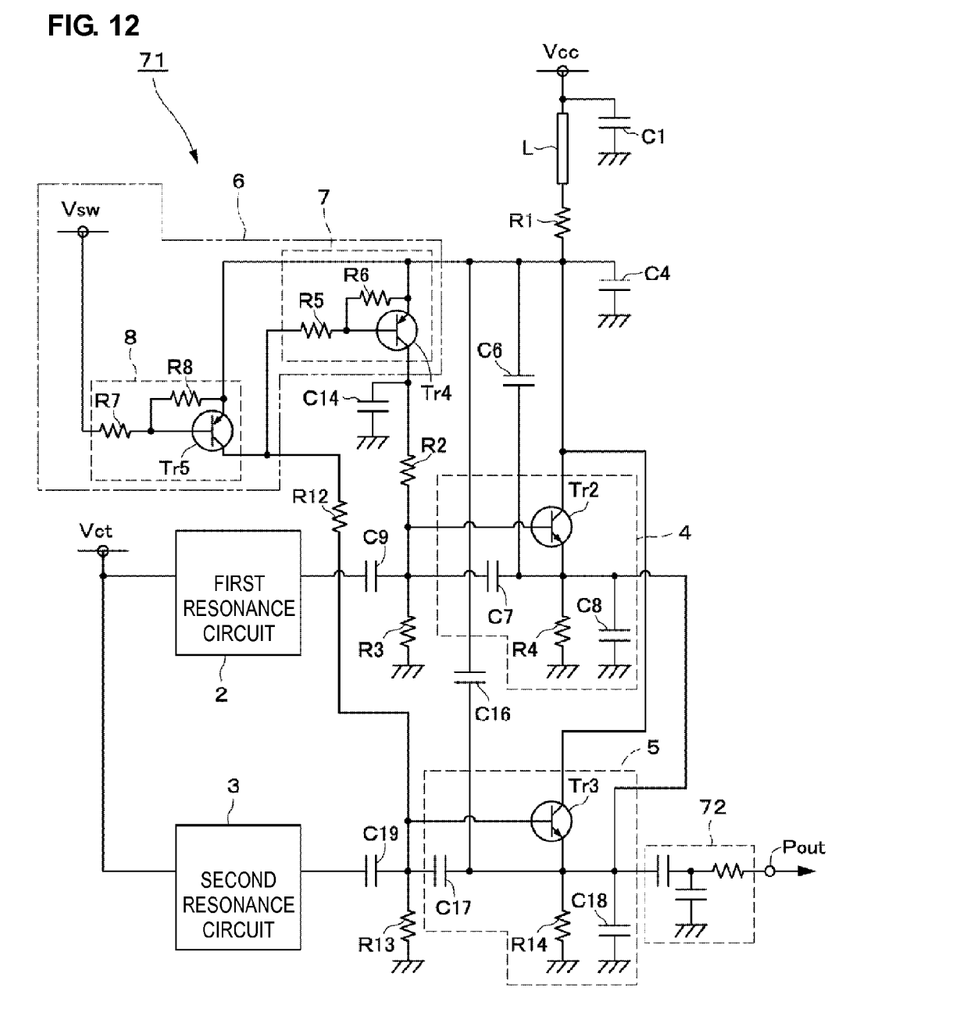
FIG. 12 is a circuit diagram illustrating a high-frequency oscillator according to a third modification.

According to the first to third preferred embodiments, the buffer circuit 9 is included in each of the high-frequency oscillators 1, 31, and 51. However, the present invention is not limited to this. For example, as a high-frequency oscillator 71 shown in FIG. 12, the buffer circuit 9 may be eliminated. In this case, each of the collector terminals of the transistor devices Tr2 and Tr3 is connected to the power source terminal Vcc through the bias resistor R1 and the line L. Each of the emitter terminals of the transistor devices Tr2 and Tr3 is connected to the oscillation-signal output terminal Pout through a matching circuit 72.

According to the first preferred embodiment, the second switch circuit 8, which is not connected to the auxiliary grounded capacitor C14, preferably is connected between the buffer circuit 9 and the bias resistor R12 similarly to the first switch circuit 7. However, it is not necessary to arrange the second switch circuit 8 to which the auxiliary grounded capacitor C14 is not connected between the buffer circuit 9 and the bias resistor R12. For example, the second switch circuit 8 may be connected between the bias resistor R12 and the second amplifier circuit 5.

Similarly, in the second preferred embodiment and the first and second modifications, a connection position of the switch circuit, which is not connected to the auxiliary grounded capacitor C14, may be changed as needed.

Furthermore, in the second preferred embodiment, the first switch circuit 7 preferably includes an NPN transistor and the second switch circuit 8 includes a PNP transistor. However, the first switch circuit 7 may include a PNP transistor and the second switch circuit 8 may include an NPN transistor.

Similarly, according to the third preferred embodiment, the first switch circuit 7 preferably includes a PNP transistor and the second switch circuit 8 includes an NPN transistor. However, the first switch circuit 7 may include an NPN transistor and the second switch circuit 8 may include a PNP transistor.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A high-frequency oscillator, comprising:
    first and second resonance circuits that resonate at frequencies different from each other;
    a first amplifier circuit that is connected to the first resonance circuit and amplifies a first resonance signal output from the first resonance circuit;
    a second amplifier circuit that is connected to the second resonance circuit and amplifies a second resonance signal output from the second resonance circuit;
    a selection circuit that is connected to the first and second amplifier circuits and that selectively operates a respective one of the first and second amplifier circuits;
    a grounded capacitor that is connected to the first and second amplifier circuits and is commonly used by the first and second amplifier circuits;
    an auxiliary grounded capacitor; and
    a buffer circuit that is commonly connected to the first and second amplifier circuits, and that amplifies a signal output from each of the first and second amplifier circuits; wherein
    the auxiliary grounded capacitor is connected in parallel to the grounded capacitor when a respective one of the first and second amplifier circuits operates;
    the auxiliary grounded capacitor is disconnected from the grounded capacitor when a respective other one of the first and second amplifier circuits operates;
    the first amplifier circuit includes a first bipolar transistor having a base terminal connected to a power source terminal through a first bias resistor;
    the second amplifier circuit includes a second bipolar transistor having a base terminal connected to the power source terminal through a second bias resistor;
    the selection circuit includes:
        a first switch circuit that turns the first bipolar transistor on and off;
        a second switch circuit that turns the second bipolar transistor on and off so that an operation state of the second bipolar transistor is different from an operation state of the first bipolar transistor; and
        an input terminal for a switch control signal that supplies a switch control signal to at least one of the first and second switch circuits to change the operation states of the first and second bipolar transistors;
    at least one of the first and second switch circuits is arranged between the power source terminal, and a corresponding at least one of the first and second bias resistors of the first and second bipolar transistors in which the operation status of the first and second bipolar transistors is switched by the at least one of the first and second switch circuits;
    the grounded capacitor is connected between the power source terminal and the at least one of the first and second switch circuits;
    the auxiliary grounded capacitor is connected between at least one of the first and second switch circuits and a corresponding at least one of the first and second bias resistors;
    the buffer circuit includes a third bipolar transistor;
    an emitter terminal of the third bipolar transistor included in the buffer circuit is cascade-connected to collector terminals of the first and second bipolar transistors; and
    one of the first and second switch circuits to which the auxiliary grounded capacitor is connected, is connected to the emitter terminal of the third bipolar transistor included in the buffer circuit.

2. The high-frequency oscillator according to claim 1, wherein the other of the first and second switch circuits is connected to an emitter resistor of a corresponding one of the first and second bipolar transistors in which an operation state thereof is switched by the other of the first and second switch circuits.

3. The high-frequency oscillator according to claim 1, wherein each one of the first and second switch circuits includes a PNP transistor or an NPN transistor.

4. An electronic apparatus including the high-frequency oscillator set forth in of claim 1.

* * * * *